(12) United States Patent
Morillon

(10) Patent No.: US 8,604,515 B2
(45) Date of Patent: Dec. 10, 2013

(54) BIDIRECTIONAL PROTECTION COMPONENT

(75) Inventor: Benjamin Morillon, Tours (FR)

(73) Assignee: STMicroelectronics (Tours) SAS, Tours (FR)

( * ) Notice: Subject to any disclaimer, the term of this patent is extended or adjusted under 35 U.S.C. 154(b) by 0 days.

(21) Appl. No.: 13/105,238

(22) Filed: May 11, 2011

(65) Prior Publication Data

US 2012/0068223 A1 Mar. 22, 2012

(30) Foreign Application Priority Data

May 11, 2010 (FR) .................................. 10 53680

(51) Int. Cl.
*H01L 29/66* (2006.01)

(52) U.S. Cl.
USPC ........... 257/173; 257/109; 257/146; 257/603; 257/E23.002; 438/133; 438/380; 438/478

(58) Field of Classification Search
USPC .......... 257/109, 146, 603, 773, 173, E23.002, 257/E21.09; 438/133, 380, 478
See application file for complete search history.

(56) References Cited

U.S. PATENT DOCUMENTS

| | | | | |
|---|---|---|---|---|
| 3,970,843 A | * | 7/1976 | Dumas | 257/626 |
| 4,042,949 A | * | 8/1977 | Davidsohn | 257/527 |
| 4,046,605 A | * | 9/1977 | Nelson et al. | 438/17 |
| 4,047,217 A | * | 9/1977 | McCaffrey et al. | 257/592 |
| 4,168,997 A | * | 9/1979 | Compton | 438/419 |
| 4,231,057 A | * | 10/1980 | Momma et al. | 257/515 |
| 4,234,355 A | * | 11/1980 | Meinders | 438/134 |
| 4,379,726 A | * | 4/1983 | Kumamaru et al. | 438/340 |
| 4,535,530 A | * | 8/1985 | Denda et al. | 438/250 |
| 4,613,884 A | * | 9/1986 | Angerstein et al. | 257/115 |
| 4,631,562 A | * | 12/1986 | Avery | 257/551 |
| 4,670,669 A | * | 6/1987 | Cottrell et al. | 327/536 |
| 4,689,651 A | * | 8/1987 | Hanna et al. | 257/563 |
| 4,824,797 A | | 4/1989 | Goth | |
| 4,825,266 A | * | 4/1989 | Whight | 257/605 |
| 4,879,584 A | * | 11/1989 | Takagi et al. | 257/334 |
| 5,119,148 A | * | 6/1992 | Anderson et al. | 257/496 |
| 5,247,230 A | * | 9/1993 | Michaud | 318/17 |
| 5,248,894 A | * | 9/1993 | Beasom | 257/519 |
| 5,296,047 A | * | 3/1994 | Fellner | 148/33 |
| 5,429,953 A | * | 7/1995 | Byatt | 438/133 |
| 5,441,900 A | | 8/1995 | Bulucea et al. | |
| 5,473,170 A | * | 12/1995 | Bernier | 257/174 |
| 5,479,031 A | * | 12/1995 | Webb et al. | 257/173 |
| 5,516,705 A | * | 5/1996 | Webb et al. | 438/133 |

(Continued)

OTHER PUBLICATIONS

French Search Report dated Nov. 17, 2010 from corresponding French Application No. 10/53680.

*Primary Examiner* — N Drew Richards
*Assistant Examiner* — Ankush Singal
(74) *Attorney, Agent, or Firm* — Wolf, Greenfield & Sacks, P.C.

(57) ABSTRACT

A bidirectional protection component formed in a semiconductor substrate of a first conductivity type including a first implanted area of the first conductivity type, an epitaxial layer of the second conductivity type on the substrate and the first implanted area, a second area of the first conductivity type on the external side of the epitaxial layer, in front of the first area, and implanted with the same dose as the first area, a first metallization covering the entire lower surface of the substrate, and a second metallization covering the second area.

34 Claims, 1 Drawing Sheet

(56) References Cited

U.S. PATENT DOCUMENTS

| | | | |
|---|---|---|---|
| 5,602,417 A * | 2/1997 | Villa | 257/593 |
| 5,719,413 A * | 2/1998 | Bernier | 257/174 |
| 5,828,089 A * | 10/1998 | Bernier | 257/173 |
| 5,880,511 A * | 3/1999 | Yu et al. | 257/497 |
| 5,899,714 A * | 5/1999 | Farrenkopf et al. | 438/202 |
| 5,973,384 A * | 10/1999 | Ikegami | 257/588 |
| 5,986,289 A * | 11/1999 | Simmonet | 257/109 |
| 6,015,999 A * | 1/2000 | Yu et al. | 257/497 |
| 6,084,253 A * | 7/2000 | Turner, Jr. | 257/107 |
| 6,368,920 B1 * | 4/2002 | Beasom | 438/270 |
| 6,373,069 B1 * | 4/2002 | Akaike et al. | 250/459.1 |
| 6,531,717 B1 * | 3/2003 | Casey et al. | 257/109 |
| 6,603,153 B2 * | 8/2003 | Francis et al. | 257/104 |
| 6,611,006 B2 * | 8/2003 | Roy | 257/150 |
| 6,781,161 B1 * | 8/2004 | Turner et al. | 257/109 |
| 7,129,144 B2 * | 10/2006 | Tseng | 438/309 |
| 7,190,006 B2 * | 3/2007 | Ducreux | 257/109 |
| 7,321,138 B2 * | 1/2008 | Ducreux | 257/109 |
| 7,384,854 B2 * | 6/2008 | Voldman | 438/380 |
| 7,638,816 B2 * | 12/2009 | Rodrigues | 257/173 |
| 7,755,102 B2 * | 7/2010 | Kao et al. | 257/173 |
| 7,786,507 B2 * | 8/2010 | Denison et al. | 257/173 |
| 7,943,959 B2 * | 5/2011 | Rodrigues | 257/173 |
| 8,431,959 B2 * | 4/2013 | Davis et al. | 257/173 |
| 8,536,682 B2 * | 9/2013 | Morillon | 257/603 |
| 2002/0130331 A1 * | 9/2002 | Nemoto et al. | 257/109 |
| 2003/0038340 A1 * | 2/2003 | Einthoven et al. | 257/546 |
| 2003/0116779 A1 * | 6/2003 | Ballon et al. | 257/107 |
| 2003/0205775 A1 * | 11/2003 | Einthoven et al. | 257/497 |
| 2003/0209724 A1 * | 11/2003 | Casey et al. | 257/173 |
| 2004/0135620 A1 * | 7/2004 | Pezzani | 327/453 |
| 2005/0245006 A1 * | 11/2005 | Tseng | 438/140 |
| 2005/0258501 A1 * | 11/2005 | Natsuaki et al. | 257/414 |
| 2007/0117336 A1 * | 5/2007 | Sumakeris et al. | 438/369 |
| 2007/0272942 A1 * | 11/2007 | Otake | 257/139 |
| 2008/0224220 A1 * | 9/2008 | Blanc et al. | 257/357 |
| 2009/0057717 A1 * | 3/2009 | Rodrigues | 257/173 |
| 2009/0079022 A1 * | 3/2009 | Keena et al. | 257/494 |
| 2009/0162988 A1 * | 6/2009 | Keena et al. | 438/400 |
| 2009/0166721 A1 * | 7/2009 | Denison et al. | 257/328 |
| 2010/0006889 A1 * | 1/2010 | Marreiro et al. | 257/106 |
| 2010/0072573 A1 * | 3/2010 | Marreiro et al. | 257/534 |
| 2010/0181597 A1 * | 7/2010 | Sun et al. | 257/173 |
| 2010/0314660 A1 * | 12/2010 | Salih et al. | 257/173 |
| 2011/0121429 A1 * | 5/2011 | Morillon | 257/603 |
| 2012/0061803 A1 * | 3/2012 | Morillon | 257/603 |

* cited by examiner

BIDIRECTIONAL PROTECTION COMPONENT

CROSS REFERENCE TO RELATED APPLICATIONS

This application claims the priority benefit of French patent application number 10/53680, filed on May 11, 2010, entitled BIDIRECTIONAL PROTECTION COMPONENT, which is hereby incorporated by reference to the maximum extent allowable by law.

BACKGROUND OF THE INVENTION

1. Field of the Invention

The present invention relates to a vertical bidirectional component of protection against overvoltages. It more specifically relates to a protection component formed of three semiconductor layers of alternated conductivity types (only PNP structures will be mentioned hereafter to simplify the present description, but NPN structures are of course also possible).

2. Discussion of the Related Art

Bidirectional protection components of the type having three alternated semiconductor layers of opposite conductivity type are well known. They are formed of two diodes of opposite biasing connected in series. In this type of component, it should be ascertained that the gain of the transistor formed by the PNP layers is too low for this transistor to be able to turn on, that is, this component only behaves as two series-connected diodes of opposite biasing.

Various structures have been provided to form a bidirectional protection diode with three alternated semiconductor layers.

FIG. 1 shows a first embodiment of a bidirectional protection component. This component is formed based on an N-type semiconductor substrate 1.

Opposite heavily-doped P-type areas 2 and 3, respectively in contact with metallizations 4 and 5, are formed on each side of the substrate, generally by implantation/diffusion. The upper and lower (or front surface and rear surface) peripheries of the component are coated with an insulating layer, currently silicon oxide, respectively 6 and 7.

The bidirectional protection component shown in FIG. 1 is very simplified. In practice, it will comprise various areas intended to improve its voltage and peripheral behavior, for example, heavily-doped N-type channel stop regions, on the upper side and on the lower side. Conventionally, during its manufacturing, this component forms an element of a semiconductor wafer which is then sawn as shown in FIG. 1.

The bidirectional protection component shown in FIG. 1 has a particularly high performance. According to the desired protection voltage, N-type substrate 1 will be more or less heavily doped and symmetrical protection voltages ranging from 6.8 to 220 volts can thus be obtained. Further, given that the component is formed from a relatively thick silicon substrate 1, for example, with a thickness ranging from 200 to 300 µm, parasitic PNP transistor 2-1-3 will have a particularly low gain and does not risk turning on, at the cost, however, of a non-negligible series resistance.

However, this component has a disadvantage as regards its assembly. Indeed, the lower surface of the component cannot be soldered to a planar conductive base since a wicking would then risk short-circuiting metallization 5 and substrate 1. A base comprising a pedestal substantially having the surface of metallization 5 must thus be provided to avoid any solder overflow towards substrate 1. This is incompatible with the forming of modern micropackages. It should indeed be noted that the side of the chip shown in FIG. 1 may have very small lateral dimensions, on the order of from 200 µm to 1 mm.

It has thus been tried to form bidirectional protection components capable of being assembled on planar conductive bases.

FIG. 2 shows an example of a structure adapted to such an assembly, currently called well structure. The component of FIG. 2 is formed from a heavily-doped P-type silicon wafer 11 ($P^+$) on which an N-type layer 12, having a thickness ranging from 10 to 30 µm, is formed by epitaxy. A central area of layer 12 of a chip is covered with a heavily-doped P-type layer 13. The periphery of the epitaxial layer of a chip is surrounded with a P-type peripheral wall 14. P area 13 is coated with a metallization 16 and the lower surface of the substrate is coated with a metallization 17. An insulating layer 18, for example, made of silicon oxide, covers the upper periphery of the chip.

The structure of FIG. 2 effectively solves the problem of the soldering of the chip on a planar conductive wafer. Indeed, even if there is a solder overflow, given that the entire periphery of the chip is of type P, no short-circuit risks to occur. This structure however has the following disadvantages.

The doping profiles of areas 11 and 13 are very different due to the difference in heat balance undergone by these layers. Indeed, layer 11 has a much more gradual doping than layer 13 since layer 11 sees the high heat balance of peripheral insulation layer 14. The two junctions 13/12 and 12/11 will thus not have the same voltage behaviors.

Given that epitaxial layer N between the two junctions is relatively thin, the voltage behavior of the two junctions 13/12 and 12/11 depends on the gain of parasitic transistor 13/12/11 and thus on the lifetime of the minority carriers, which is variable and difficult to control during the manufacturing process. This gain may also cause a break-over. phenomenon, which may be prejudicial in some applications of protection devices.

The voltage range of this type of device is limited to low voltages (on the order of 30 V) by the technique of insulation by diffusion. It indeed implies a significant wicking of substrate 11 and thus a residual N area 12.

Thus, the diode of FIG. 2 has advantages in terms of assembly but at the cost of significant disadvantages: a limited protection voltage range, dissymmetrical protection voltages, a break-over phenomenon, and a sensitivity to the manufacturing process.

SUMMARY OF THE INVENTION

An object of the present invention is to provide a bidirectional protection component which solves all the disadvantages of prior art structures. In particular, an embodiment of the present invention aims at providing a bidirectional protection component which:

is symmetrical, that is, has a same breakdown voltage for the two biasings of the applied voltage, enables to obtain a wide range of protection voltages, has a low sensitivity to the manufacturing process, can be assembled by soldering in a micropackage, that is, on a planar conductive plate.

According to an embodiment of the present invention, the bidirectional protection component formed in a semiconductor substrate of a first conductivity type comprises a first implanted area of the first conductivity type, an epitaxial layer of the second conductivity type on the substrate and the first implanted area, a second area of the first conductivity type on the external surface of the epitaxial layer, in front of the first area, and implanted with the same dose as the first area, a first metallization covering the entire lower surface of the substrate, and a second metallization covering the second area.

According to an embodiment of the present invention, outside of the first and second areas, an insulated trench crosses the epitaxial layer.

According to an embodiment of the present invention, the trench is formed through a heavily-doped ring of the second conductivity type, used as a channel stop.

According to an embodiment of the present invention, the epitaxial layer has a doping level ranging between $10^{15}$ and $6.10^{17}$ atoms/cm$^3$.

According to an embodiment of the present invention, the epitaxial layer is submitted to an operation of decrease of the lifetime of minority carriers, for example, by electron or neutron irradiation or implantation of heavy ions such as platinum or gold.

The foregoing and other objects, features, and advantages of the present invention will be discussed in detail in the following non-limiting description of specific embodiments in connection with the accompanying drawings.

DETAILED DESCRIPTION

As usual in the representation of integrated circuits, the various drawings are not to scale.

Figure 1:
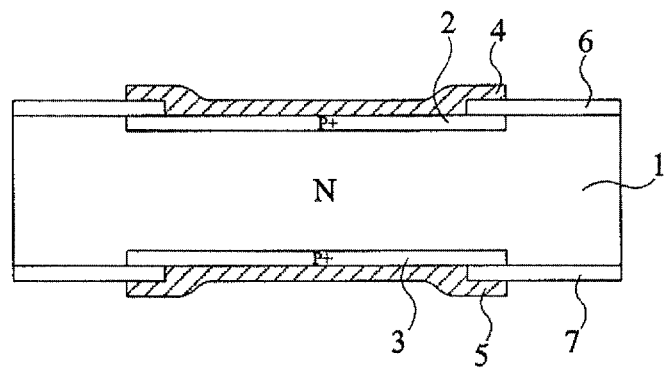
FIGS. 1 and 2 are simplified cross-section views of conventional bidirectional protection components.
Figure 2:
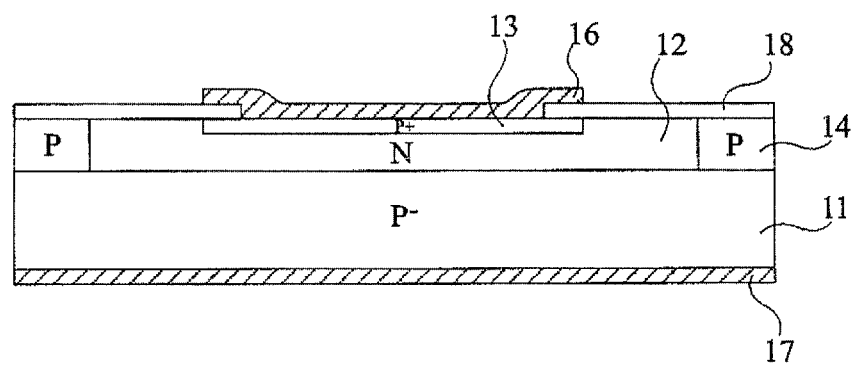
Figure 3:
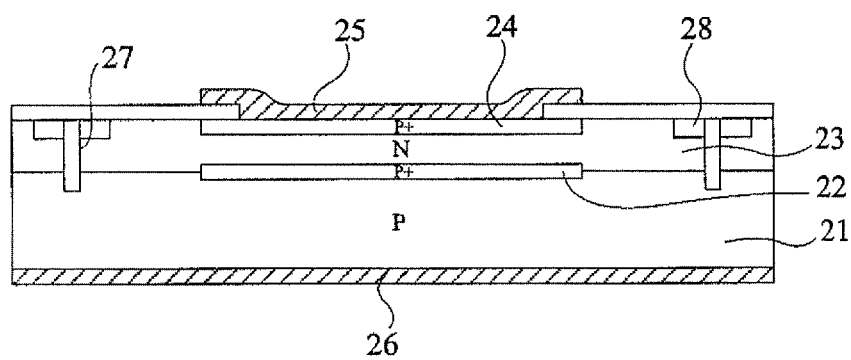
FIG. 3 is a simplified cross-section view of a dissymmetrical monolithic bidirectional protection component according to an embodiment.

FIG. 3 is a simplified cross-section view of a bidirectional protection component. This bidirectional protection component is formed from a heavily-doped P-type substrate 21. On the upper surface or front surface of the substrate is formed, currently by implantation, a. heavily-doped P-type area 22, substantially at the center of the chip. An N-type doped epitaxial layer 23 having its doping adjusted according to the desired breakdown voltage of the device is grown on this structure. On the front surface of epitaxial layer 23 is formed a heavily-doped P-type area 24, in front of area 22. Area 24 is covered with a metallization 25 and the entire rear surface of the substrate is covered with a metallization 26. The lateral insulation of the structure is performed by a trench 27 having at least its walls coated with an insulator. Conventionally, these walls will be coated with silicon oxide and the trench is filled with polysilicon. For strong protection voltages greater than 100 V (and thus a low doping level of N area 23), the trenches are preferably dug in a heavily-doped N-type peripheral ring 28 (channel stop ring).

The structure of FIG. 3 has many advantages.

A first advantage is that it may be dissymmetrical in terms of voltage, that is, the breakdown may occur in the same way with a positive or negative biasing, since:

the implantations intended to form areas 22 and 24 may be performed at the same doses and result in providing areas of same doping level;

the peripheries of areas 22 and 24 have the same appearance; and the fact of laterally insulating epitaxial layer 23 with a trench enables to keep the characteristics of the structure in terms of symmetry. Indeed, the heat balance of the filling of the trenches (at the beginning of the manufacturing process) is very short as compared with the heat balance of diffusion of area 14 into the prior structure. Areas 22 and 24 are thus submitted to a substantially equal heat balance and thus have a substantially identical doping profile. An additional advantage of a trench insulation is to limit the chip surface area.

Another advantage is that the fact for central region 23 to result from an epitaxy and for the two extreme areas 22 and 24 to result from implantations enables to select the dopings of these regions and areas within wide ranges of values and thus to select protection voltages within a wide range of values, currently from 10 to 220 volts.

A third advantage of course is that the structure can be assembled by soldering in a micropackage, given that a wicking at the periphery does not risk to cause a short-circuit.

According to the desired voltage, to the dopings and thicknesses of layer 23, the gain of the parasitic transistor may have an influence upon the voltage behavior of the device. If the gain is too high, an operation of decrease of the lifetime of minority carriers, for example, by electron or neutron irradiation or implantation of heavy ions such as platinum or gold, may be carried out.

In a practical embodiment, a boron-doped substrate having a resistivity on the order of 5 mΩ.cm has been used. The implantation of layer 22 has been performed with boron atoms at a dose from 1 to $2.10^{16}$ atoms/cm$^2$ to obtain a concentration greater than that of the substrate.

The epitaxy has been performed to obtain a resistivity ranging between 30 mΩ.cm and 3 Ω.cm (doping from $10^{15}$ to $6.10^{17}$ atoms/cm$^3$). The thickness of this epitaxial layer, before diffusion of the P regions, is on the order of from 20 to 100 μm. The implantation intended to form layer 24 is performed with the same dose as that of layer 22. After anneal, P$^+$ regions 22 and 24 extend from 2 to 10 μm into the epitaxial layer.

The lifetime control has been performed either by diffusion of platinum, or by electron irradiation.

Various simulations carried out on this structure have effectively shown an excellent symmetry of operation.

Of course, the present invention is likely to have many variations in terms of insulators used, metallizations, dimensions and doping levels, which will be selected by those skilled in the art according to the desired component performances.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method of manufacturing a bidirectional protection component formed in a semiconductor substrate of a first conductivity type, comprising:

implanting, on the semiconductor substrate, a first area of the first conductivity type, epitaxing a layer of the second conductivity type on the substrate and the first area, implanting a second area of the first conductivity type on the external surface of the epitaxial layer, in front of the first area, with the same dose as the first area, covering the entire lower surface of the substrate with a first metallization, and covering the second area with a second metallization.

2. The method of claim 1, further comprising forming, outside of the first and second areas, an insulated trench crossing the epitaxial layer.

3. The method of claim 1, wherein the epitaxial layer has a doping level between $10^{15}$ and $6.10^{17}$ atoms/cm$^3$.

4. The method of claim 1, further comprising decreasing a lifetime of minority carriers of the epitaxial layer.

5. The method of claim 2, wherein forming the insulated trench comprises forming a heavily-doped ring of the second conductivity type to act as a channel stop.

6. The method of claim 4, wherein decreasing the lifetime of minority carriers of the epitaxial layer comprises performing electron or neutron irradiation.

7. The method of claim 4, wherein decreasing the lifetime of minority carriers of the epitaxial layer comprises implanting heavy ions.

8. The method of claim 7, wherein implanting heavy ions comprises implanting platinum or gold.

9. A bidirectional protection component formed in a semiconductor substrate of a first conductivity type, comprising:
a first implanted area of the first conductivity type on the semiconductor substrate,
an epitaxial layer of the second conductivity type on the substrate and the first implanted area,
a second area of the first conductivity type on the external surface of the epitaxial layer, in front of the first area, and implanted with the same dose as the first area,
a first metallization covering the entire lower surface of the substrate, and
a second metallization covering the second area.

10. The bidirectional protection component of claim 9, wherein, outside of the first and second areas, an insulated trench crosses the epitaxial layer.

11. The bidirectional protection component of claim 9, wherein the epitaxial layer has a doping level ranging between $10^{15}$ and $6.10^{17}$ atoms/cm$^3$.

12. The bidirectional protection component of claim 9, wherein the epitaxial layer has a structure formed by submission of the epitaxial layer to an operation of decreasing a lifetime of minority carriers.

13. The bidirectional protection component of claim 9, wherein the epitaxial layer comprises platinum or gold.

14. The bidirectional protection component of claim 10, wherein the trench is formed through a heavily-doped ring of the second conductivity type, used as a channel stop.

15. The bidirectional protection component of claim 12, wherein the epitaxial layer has a structure formed by electron or neutron irradiation of the epitaxial layer.

16. The bidirectional protection component of claim 12, wherein the epitaxial layer has a structure formed by implantation of heavy ions into the epitaxial layer.

17. The bidirectional protection component of claim 16, wherein the epitaxial layer has a structure formed by implantation of platinum or gold into the epitaxial layer.

18. An apparatus comprising:
a first area of a first conductivity type implanted on a first surface of a semiconductor substrate;
an epitaxial layer of the second conductivity type formed on the first surface of the semiconductor substrate and a surface of the first area;
a second area of the first conductivity type implanted on a first surface of the epitaxial layer, opposite a second surface of the epitaxial layer contacting the first area, and having a same dose of dopant as the first area;
a first metallization contacting a second surface of the semiconductor substrate opposite the first surface, and
a second metallization contacting the second area.

19. The apparatus of claim 18, wherein the first metallization contacts an entirety of the second surface of the semiconductor substrate.

20. The apparatus of claim 18, further comprising a trench formed in the epitaxial layer, wherein the trench does not contact the first area or the second area.

21. The apparatus of claim 18, wherein the epitaxial layer has a doping level between $10^{15}$ and $6.10^{17}$ atoms/cm$^3$.

22. The apparatus of claim 18, wherein the semiconductor substrate is of the first conductivity type and the first area is more heavily doped than the semiconductor substrate.

23. The apparatus of claim 20, wherein the trench extends through the epitaxial layer and extends through at least a portion of the semiconductor substrate.

24. The apparatus of claim 20, further comprising an insulating material disposed in the trench.

25. The apparatus of claim 20, further comprising a material of the second conductivity type disposed in the trench.

26. The apparatus of claim 24, wherein:
the insulating material is disposed along walls of the trench; and
the apparatus further comprises polysilicon disposed in the trench.

27. A method comprising:
implanting, on a first surface of a semiconductor substrate, a first area of a first conductivity type;
epitaxing a layer of a second conductivity type on the first surface of the semiconductor substrate and a surface of the first area;
implanting a second area of the first conductivity type on a first surface of the epitaxial layer, opposite a second surface of the layer contacting the first area, with a same dose as the first area,
forming, on a second surface of the semiconductor substrate opposite the first surface, a first metallization; and
forming, on the second area, a second metallization.

28. The method of claim 27, wherein forming the first metallization comprises forming the first metallization on an entirety of the second surface of the substrate.

29. The method of claim 27, further comprising foiming a trench formed in the epitaxial layer, wherein the trench does not contact the first area or the second area.

30. The method of claim 27, wherein epitaxing the layer comprises forming the layer with a doping level between $10^{15}$ and $6.10^{17}$ atoms/cm$^3$.

31. The method of claim 27, wherein:
the semiconductor substrate is of the first conductivity type; and
implanting the first area on the first surface of the semiconductor substrate comprises forming the first area more heavily doped than the semiconductor substrate.

32. The method of claim 29, wherein forming the trench comprises forming the trench extending through the epitaxial layer and extending through at least a portion of the semiconductor substrate.

33. The method of claim 29, further comprising disposing a material of the second conductivity type in the trench.

34. The method of claim 29, further comprising disposing an insulating material and/or a polysilicon in the trench.

* * * * *

UNITED STATES PATENT AND TRADEMARK OFFICE
CERTIFICATE OF CORRECTION

PATENT NO.       : 8,604,515 B2                                        Page 1 of 1
APPLICATION NO.  : 13/105238
DATED            : December 10, 2013
INVENTOR(S)      : Benjamin Morillon It is certified that error appears in the above-identified patent and that said Letters Patent is hereby corrected as shown below:

In the Claims:

Col. 6, claim 29, line 42 should read:

29. The method of claim 27, further comprising forming a

Signed and Sealed this
Eleventh Day of March, 2014

Michelle K. Lee
*Deputy Director of the United States Patent and Trademark Office*